(12) United States Patent
Shim et al.

(10) Patent No.: US 7,816,910 B2
(45) Date of Patent: Oct. 19, 2010

(54) TEST HANDLER HAVING SIZE-CHANGEABLE TEST SITE

(75) Inventors: Jae Gyun Shim, Suwon-si (KR); Yun Sung Na, Cheonan-si (KR); In Gu Jeon, Suwon-si (KR)

(73) Assignee: Techwing Co., Ltd. (KR)

( * ) Notice: Subject to any disclaimer, the term of this patent is extended or adjusted under 35 U.S.C. 154(b) by 0 days.

(21) Appl. No.: 12/574,395

(22) Filed: Oct. 6, 2009

(65) Prior Publication Data
US 2010/0019790 A1  Jan. 28, 2010

Related U.S. Application Data (63) Continuation of application No. 11/817,192, filed as application No. PCT/KR2006/000669 on Feb. 27, 2006, now abandoned.

(30) Foreign Application Priority Data

| Feb. 28, 2005 | (KR) | ................. 20-2005-0005351 U |
| May 23, 2005 | (KR) | ..................... 10-2005-0042857 |
| Dec. 7, 2005 | (KR) | ..................... 10-2005-0118487 |

(51) Int. Cl.
*G01R 31/26* (2006.01)
(52) U.S. Cl. ................... 324/158.1; 324/765
(58) Field of Classification Search ................. 324/765, 324/158.1; 414/222.01, 222.02
See application file for complete search history.

(56) References Cited

U.S. PATENT DOCUMENTS

| 6,703,852 | B1* | 3/2004 | Feltner ....................... 324/754 |
| 7,667,453 | B2* | 2/2010 | Shim et al. ................ 324/158.1 |
| 2008/0253869 | A1* | 10/2008 | Yun Sung et al. ...... 414/222.03 |
| 2009/0153168 | A1* | 6/2009 | Beom et al. .................. 324/755 |

OTHER PUBLICATIONS

Invalidations of Registration of KR Patent No. 10-532626 (Patent Court Div. 3 & Supreme Court of KR Div. 1 Judgments).

* cited by examiner

*Primary Examiner*—Ha Tran T Nguyen
*Assistant Examiner*—Richard Isla Rodas
(74) *Attorney, Agent, or Firm*—Baker & Hostetler, LLP

(57) ABSTRACT

A test handler (122) of the present invention includes a main body, a window (142) formed on a surface of the main body and having a size corresponding to a Hi-Fix board of M×N array (where M and N represent an integer greater than a value of =), a cover (170) detachably fixed to the main body t close a part of the window and convert the window into the test site having a size corresponding to a [M−A)×(n−B)] Hi-Fix board (where A is an integer equal to or greater than 0 but smaller than M, and B is an integer having a value other than 0). In the test handler, the size of window is easily modified to adapt that of the Hi-Fix board of M×N array by closing or opening a part of the window using the cover. Therefore, the test handler is capable of applying Hi-Fix boards having different sizes.

24 Claims, 5 Drawing Sheets

TEST HANDLER HAVING SIZE-CHANGEABLE TEST SITE

CROSS-REFERENCES TO RELATED APPLICATIONS

This application is a Continuation Application of U.S. application Ser. No. 11/817,192, filed on Aug. 27, 2007 now abandoned as an entry into the national phase from PCT/KR2006/000669, filed on Feb. 27, 2006, which claims priority to Korean Utility Model Application No. 20-2005-0005351, filed on Feb. 28, 2005, Korean Patent Application No. 10-2005-0042857, filed on May 23, 2005 and Korean Patent Application No. 10-2005-0118487, filed on Dec. 7, 2005.

TECHNICAL FIELD

The present invention relates to a test handler for transferring semiconductor devices and carrying out sorting thereof by being connected to semiconductor test equipment for testing the semiconductor devices or a package thereof; and, more particularly, to a test handler having a size-changeable test site.

BACKGROUND ART

In order to reduce manufacturing costs for semiconductor devices, a cost for testing them needs to be reduced by shortening the test time. To this purpose, if a test equipment having a higher processing speed is developed, a handler offering a greater throughput unit per hour is also required to fully utilize the improved capability of the test equipment.

Most of semiconductor test equipments carry out test of semiconductor devices by using a Hi-Fix board having m×n sockets. That is, after aligning the Hi-Fix board of the test equipment with a test site of a handler, semiconductor devices loaded in inserts on a test tray are brought into contact with the sockets on the Hi-Fix board, so that m×n semiconductor devices can be tested at the same time. Accordingly, the sizes of the test site and the test tray are generally determined based on the size of the Hi-Fix board. In particular, the size of the test site is an important factor that determines the maximum throughput of the test handler.

Figure 1:
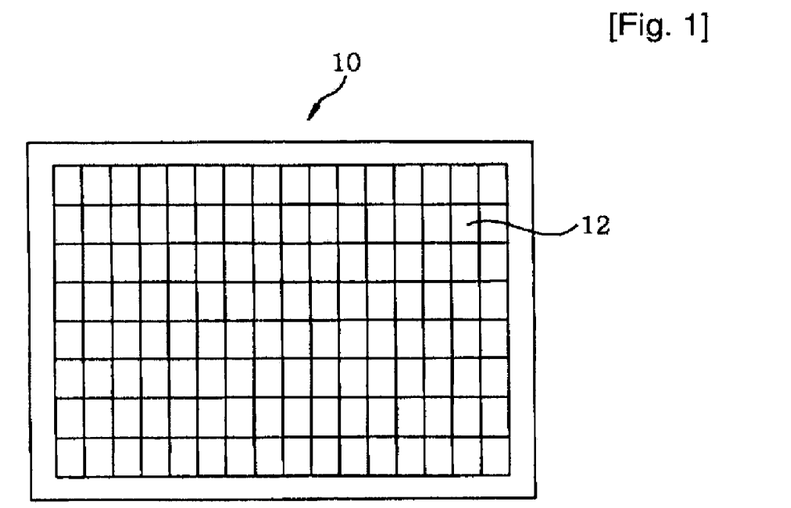
FIG. 1 is a schematic plan view of an 8×16 Hi-Fix board having 128 sockets.
Figure 2:
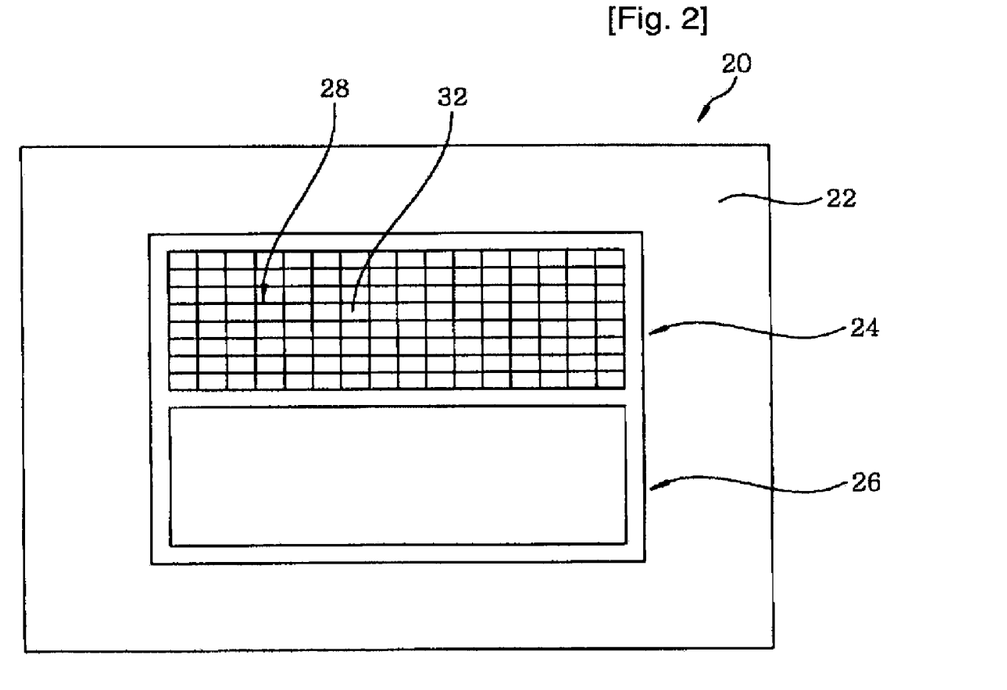
FIG. 2 sets forth a schematic front view to show a main body and a first and a second test site of a conventional vertical test handler having a size corresponding to the Hi-Fix board of FIG. 1.

FIG. 1 illustrates a schematic plan view of a Hi-Fix board 10 having 128 sockets arranged in an array of 8 rows and 16 columns; and FIG. 2 sets forth a schematic front view of a main body 22, a first and a second test site 24 and 26 of a conventional vertical test handler 20 that is otherwise called a side-docking test handler, wherein each of the test sites 24 and 26 is designed to correspond to the Hi-Fix board 10 in FIG. 1.

Each of the first and the second test site 24 and 26 is of a window type formed on any one side of the main body 22, and a single test tray 28 can be placed in each of the test sites 24 and 26. The test tray 28 is accommodated in a certain section of the handler 20, and after being performed a designated internal transfer process and/or a heating/cooling process, the test tray 28 is placed in each of the first and the second test site 24 and 26 or selectively in only one of them. Disposed behind the test tray 28 is a work press (not shown) for supporting the test tray 28. The test tray 28 includes inserts 32 corresponding to the sockets 12 of the Hi-Fix board 10. The inserts 32 are arranged in an 8×16 matrix pattern, which is identical to the array of the sockets 12 on the Hi-Fix board 10. One or two semiconductor devices or packages to be tested (not shown) are loaded in each insert 32.

If the work press behind the test tray 28 moves the test tray 28 forward while the Hi-Fix board 10 of the semiconductor test equipment (not shown) is aligned with, e.g., the first test site 24 of the test handler 20, the semiconductor devices loaded in the inserts 32 of the test tray 28 are brought into contact with the sockets 12 of the Hi-Fix board 10, whereby tests of the semiconductor devices are carried out.

The Hi-Fix board 10 of the test equipment and the test tray 28 of the test handler 20 need to be configured to correspond to each other, and the Hi-Fix board 10 and the test sites 24, 26 of the test handler 20 should be matched with each other. Therefore, the sizes of the test sites 24, 26 and the test tray 28 are determined depending on the size of the Hi-Fix board. Here, given that the size of the Hi-Fix board 10 is determined by the number of the sockets 12 installed thereon, which is in turn determined by the processing speed of the test equipment and the type of test to be performed, the sizes of the test sites 24, 26 and the test tray 28 of the test handler 20 are regarded to be dependent upon the processing speed of the test equipment and the type of test as well.

For example, in case the test equipment has a maximum processing speed capable of processing 128 semiconductor devices at one time for a certain test, the Hi-Fix board 10 with the 128 sockets in the 8×16 array as shown in FIG. 1 is generally utilized. If the Hi-Fix board 10 has an external size of 404 mm×344 mm to accommodate the 8×16 sockets thereon, each of the test sites 24 and 26 of the test handler 10 is formed to have the same size as that of the Hi-Fix board 10 or slightly bigger than that. Also, the size and the pitch of the inserts 32 on the test tray 28 should be identical to those of the sockets 12 on the Hi-Fix board 10 to enable the tests of the semiconductor devices.

Conventionally, the test handler 20 is fabricated with the size of the test sites 24 and 26 and the test tray 28 permanently fixed. Thus, the test handler 20 can only be dedicated to a specific test equipment (or a test equipment having the same processing speed as that of the test equipment employed) and its exclusive Hi-Fix board 10 according to which the aforementioned size is determined. Further, the test handler 20 cannot be used for any other higher-performance test equipment or any other larger-size Hi-Fix board. More specifically, the conventional test handler 20 designed for the test equipment capable of testing 128 semiconductor devices at one time and the 8×16 Hi-Fix board 10 for use therein can only be applied to them but cannot be used for a new test equipment with a faster processing speed and a larger-size Hi-Fix board in an array of, e.g., an 8×20 matrix. This limitation in the compatibility of the conventional test handler 20 results from the fixed sizes of each test site and the test tray and also from its thereby delimited throughput (UPH: Units Per Hour).

That is to say, even if a new test equipment provides an improved capability for inspecting 160 semiconductor devices at one time for a certain test, the performance of the test equipment would not be fully manifested if the test sites and the test tray of the conventional test handler cannot be matched with a Hi-Fix board with 160 sockets (e.g., 8×20 Hi-Fix board). With regard to the conventional structure of the test handler, however, it is almost impossible to modify the test sites which were already formed. Therefore, to use the new test equipment of a higher performance, a new test handler compatible therewith must be purchased for the purpose of reducing the test time.

DISCLOSURE OF INVENTION

Technical Problem

It is, therefore, an object of the present invention to provide a high-compatibility test handler having a size-changeable test site.

Technical Solution

In accordance with the present invention, there is provided a test handler, which includes: a main body; a window formed on a surface of the main body and having a size corresponding to a Hi-Fix board of M×N array (where M and N represent an integer greater than a value of 0); a cover detachably fixed to the main body to close a part of the window and convert the window into a test site having a size corresponding to a [(M−a)×(N−b)] Hi-Fix board (where A is an integer equal to or greater than 0 but smaller than M, and B is an integer equal to or greater than 0 but smaller than N, and where at least one of A and B is an integer having a value other than 0).

BRIEF DESCRIPTION OF THE DRAWINGS

The above and other objects and features of the present invention will become apparent from the following description of preferred embodiments given in conjunction with the accompanying drawings, in which.

BEST MODE FOR CARRYING OUT THE INVENTION

Figure 3:
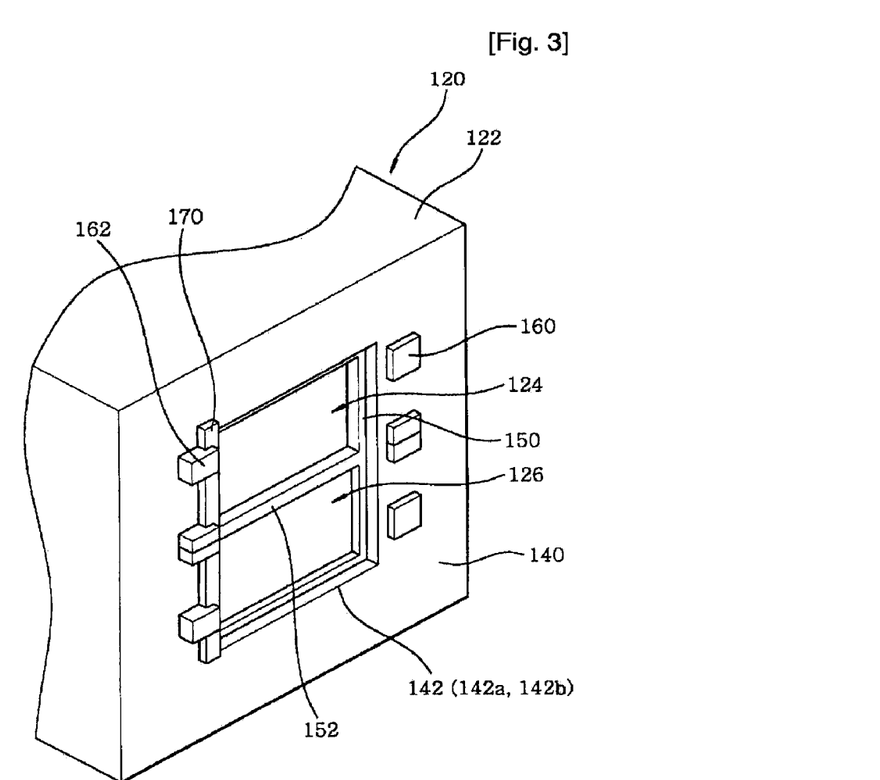
FIG. 3 presents a schematic perspective view of a test handler in accordance with a preferred embodiment of the present invention.
Figure 4:
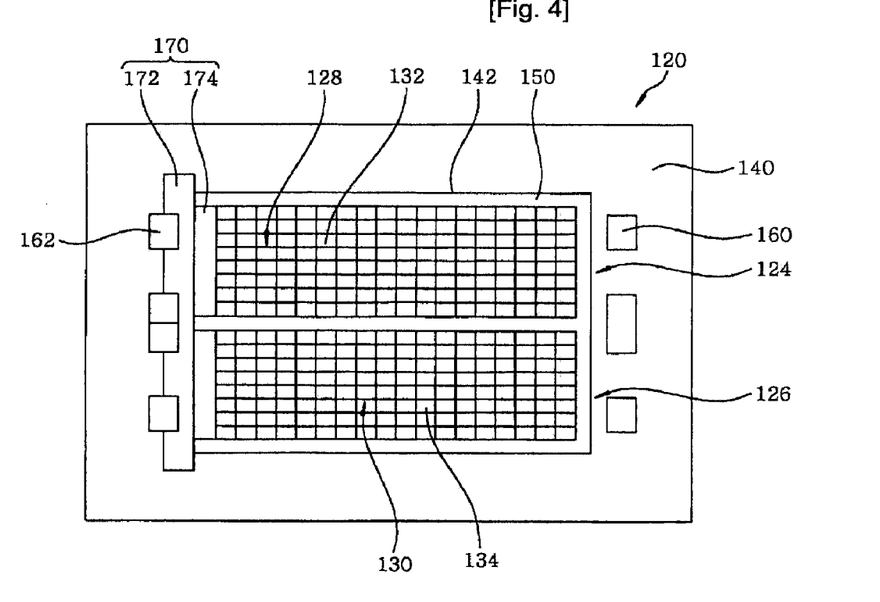
FIG. 4 offers a detailed perspective view to illustrate test sites of the test handler of FIG. 3.

Referring now to FIGS. 3 and 4, there are provided a schematic perspective view of a test handler in accordance with a preferred embodiment of the present invention and a detailed perspective view to illustrate test sites of the test handler.

The test handler 122 includes a window 142 formed in any one side of a handler main body 122. Hi-Fix board supports 150 and 152 are installed in the window 142 such that they are extended inward. The Hi-Fix board supports 150 and 152 in general are made of a resin and are coupled to the handler main body 122 via bolts (not shown) or the like. The window 142 is divided into an upper window 142a and a lower window 142b by the Hi-Fix board support 152, which is horizontally arranged. Each of the upper and the lower window 142a and 142b has an external size corresponding to an M×N Hi-Fix board (not shown) (for example, M=8, N=20).

On the right and left side of the window 142, first and second locking devices 160 and 162 are connected to the handler main body 122 via bolts (not shown) or the like. The first and the second locking devices 160 and 162 are used to fix a Hi-Fix board (as shown in FIG. 1) in the window 142. As clearly shown in FIG. 4, the first locking device 160 includes a first locking cylinder 160a, a first locking clamp 160b and a first clamp guide block 160c, while the second locking device 162 includes a second locking cylinder 162a, a second locking clamp 162b and a second clamp guide block 160c. In the preferred embodiment of the present invention, the first and the second locking cylinders 160a and 162a are substantially same components, and the second locking clamps 162b and the second clamp guide blocks 162c are elongated in a horizontal direction longer than the first locking clamps 160a and the first clamp guide blocks 160c, i.e., the lengths of the second locking clamps 162b and the second clamp guide blocks 162c are configured to be longer than those of the first locking clamps 160b and the first clamp guide blocks 160c, to support a cover 170 and so forth. However, it should be noted that the test handler 122 in accordance with the present invention is not limited to this configuration.

Some area of the window 142 is closed by a vertically elongated rectangular cover 170. Accordingly, the widths of the upper and the lower window 142a and 142b are reduced by the presence of the cover 170. The upper and the lower window 142a and 142b having the reduced widths define a first and a second test site 124 and 125, respectively. Each of the first and the second test site 124 and 125 has a size corresponding to a [(M−A)×(N−B)] Hi-Fix board (for example, M=8, N=20, A=0, B=4).

The cover 170 includes a support portion 172 and an extension portion 174 (see, FIG. 5), wherein the support portion 172 is made of a metal similar or identical to that forming the handler main body 122 while the extension portion 174 is made of an insulating resin material similar or identical to that forming the Hi-Fix board supports 150 and 152. Further, the support portion 172 of the cover 170 is fixed on the handler main body 122 by means of the second clamp guide blocks 162c of the second locking devices 162; however, the present invention is not limited thereto. For example, the support portion 172 can be fastened to the handler main body 122 directly by using bolts or the like.

Figure 5:
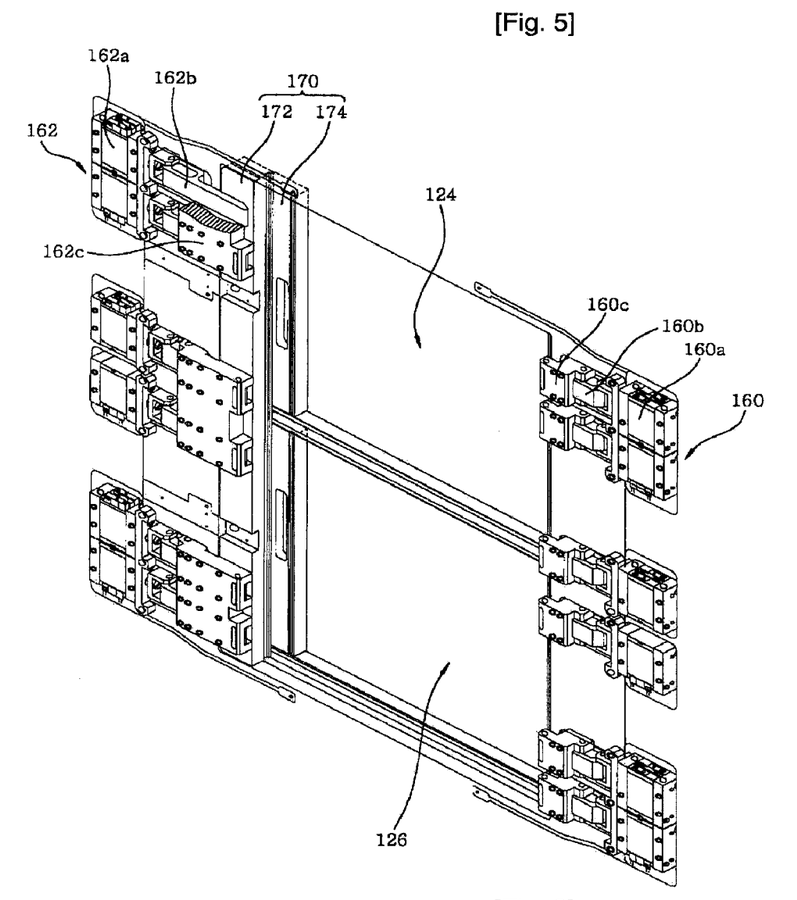
FIG. 5 provides a front view of the test handler of FIG. 3 in which two test trays are shown to be respectively exposed through the first and the second test site in case M, N, A and B of a [(M−A)×(N−B)] Hi-Fix board are set to have a value of 8, 2, 0 and 4, respectively.

The extension portion 174 of the cover 170 has the same function as those of the Hi-Fix board supports 150 and 152. That is, when matching each of the test sites 124 and 125 with a Hi-Fix board, the extension portion 174 of the cover 170 and the Hi-Fix board supports 150 and 152 jointly support the edge portion of the Hi-Fix board.

If the cover 170 is detached from the test handler 120 configured as described above, the upper and the lower window 142a and 142b corresponding to the external size of the M×N Hi-Fix board are exposed, so that it is possible to use the upper and the lower window 142a and 142b as test sites for the M×N Hi-Fix board.

In accordance with the present invention, in case of attaching the cover 170 to the handler main body 122, the first and the second test site 124 and 126 corresponding to the [(M−A)×(N−B)] Hi-Fix board (A=0) can be obtained, so that it is possible to use the test handler 120 for the [(M−A)×(N−B)] Hi-Fix board (A=0). On the other hand, if the cover 170 is removed from the handler main body 122, the upper and the lower window 142a and 142b each corresponding to the M×N Hi-Fix board are exposed, so that it is possible to use the test handler 120 for the M×N Hi-Fix board. That is, the test handler 120 can be used for both the [(M−A)×(N−B)] Hi-Fix board (A=0) and the M×N Hi-Fix board. Here, if there is a likelihood that the M×N Hi-Fix board may be interfered by such components as the second locking devices 162 when the test handler 120 is applied to the M×N Hi-Fix board, those components need to be removed or replaced.

Figure 6:
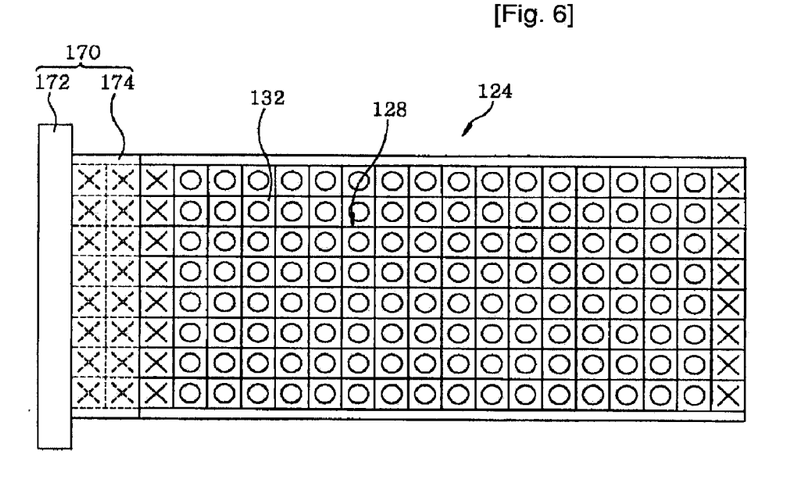
FIG. 6 is an enlarged plan view of the first test site shown in FIG. 5 and the test tray exposed therethrough.

FIG. 5 is a front view showing a state where test trays 128 and 130 are exposed through the first and the second test site 124 and 126 of the test handler 120 shown in FIG. 3 when M, N, A and B are set to have a value of 8, 20, 0 and 4, respectively. FIG. 6 presents an enlarged plan view of the first test site 123 and the test tray 28 exposed outside therethrough. In FIG. 6, the areas marked by 'O' are where inserts 132 are installed to be used for test, whereas the areas marked by 'x' do not accommodate inserts thereon or will not be used for test even though inserts are installed thereon.

The test tray 128 shown in FIGS. 5 and 6 has 8×16 inserts on appropriate locations thereon to be applied to an 8×16 Hi-Fix board. However, this tray 128 can also be applied to an 8×20 Hi-Fix board simply by installing additional inserts thereon. Specifically, in case of applying the test tray 128 to the 8×16 Hi-Fix board, inserts are installed on the entire area of the test tray 128 except on the area in the first to the third columns from the cover 170 (i.e., the first three columns from the left side of FIG. 6) and on the area in the first column from the opposite side (i.e., the rightmost column in FIG. 6). On the other hand, in case of applying the test tray 128 to the 8×20 Hi-Fix board, inserts are installed on the entire area of the test tray 128. Though it is possible to apply such a test tray 128 to the 8×16 Hi-Fix board, it is more preferable to use the test tray 128 by changing the number of inserts installed thereon because the inserts are of a high price. That is to say, in accordance with the present invention, the test tray 128 can be used for both the 8×16 Hi-Fix board and the 8×20 Hi-Fix board. Therefore, component sharing is possible, thus resulting in a reduction of manufacturing costs.

Figure 7:
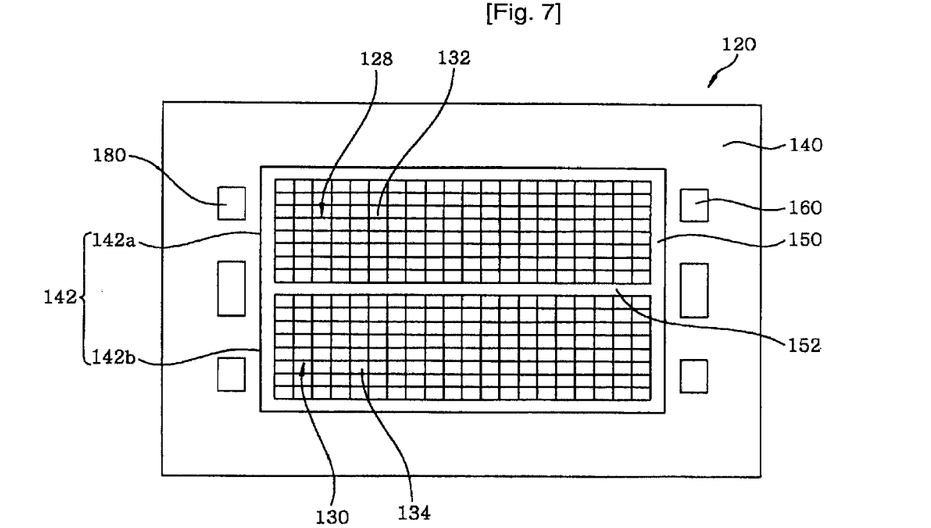
FIG. 7 depicts a front view of the test handler of FIG. 5 from which a cover is removed.
Figure 8:
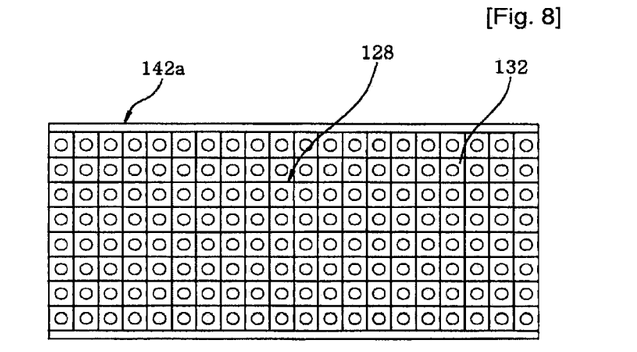
FIG. 8 shows an enlarged plan view of either one of the test sites shown in FIG. 7.

FIG. 7 is a front view showing a test handler 120 from which its cover 170 is removed to be applied to an 8×20 Hi-Fix board, and FIG. 8 sets forth an enlarged plan view of one of the two test sites of the test handler 120. Second locking devices 180 in FIG. 7 can be the same components as first locking devices 160 or they can be configured by removing some parts such as the second clamps 162a and the second clamp guide blocks 162c from the second locking devices 162 shown in FIG. 4 or replacing them by other elements.

As illustrated in FIG. 7, if the cover 170 shown in FIG. 5 is removed, the entire area of the window 142 is exposed, whereby it becomes possible to use the upper and the lower window 142a and 142b, each having a width larger than those of the first and the second test sites 124 and 126 in FIG. 5, as a new first and a new second test site each corresponding to the 8×20 Hi-Fix board. In this case, inserts 132 are installed on the entire area of the test tray 128 as shown in FIG. 8, wherein the inserts 132 match with sockets of the 8×20 Hi-Fix board in one-to-one correspondence in terms of their sizes and pitches.

Though the preferred embodiments have been described for the case of using the vertically elongated rectangular cover 170, the cover can be of various shapes. Below, various modifications of the cover will be described in detail.

Figure 9:
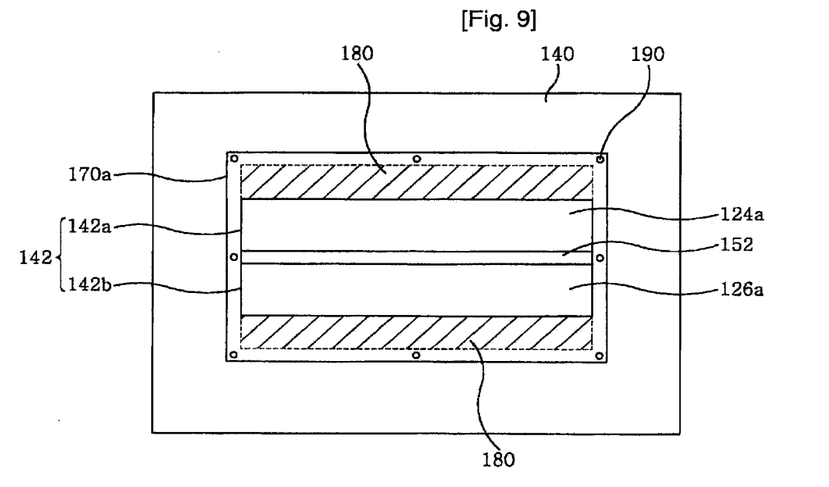
FIG. 9 schematically shows one surface of a test handler having a cover in accordance with a modification of the preferred embodiment of the present invention.

FIG. 9 provides a schematic view illustrating another modification of a cover attached to any one surface of a test handler.

In a test handler 120, a window 142 is closed by a cover 170a. The cover 170a is provided with a central opening through which an upper and a lower window 142a and 142b are partially exposed. Other than the areas exposed through the central opening of the cover 170a, rest areas 180 (as indicated by shaded portions) of the upper and the lower window 142a and 142b are closed by the cover 170a. Accordingly, a horizontal and/or a vertical width of the upper and the lower window 142a and 142b are reduced by the presence of the cover 170a. In this example shown in FIG. 9, some upper rows of the upper window 142a and some lower rows of the lower window 142b can be closed by the cover 170a at the same time.

The upper and the lower window 142a and 142b having reduced areas by the cover 170a form a first test site 124a and a second test site 126a, respectively. Each of the first and the second test site 124a and 126a has a size corresponding to a [(M−A)×(N−B)] Hi-Fix board (for example, M=8, N=20, A=4, B=0).

Test trays mounted in the upper and the lower window 142a and 142b are connected to respective [(M−A)×(N−B)] Hi-Fix boards (for example, M=8, N=20, A=4, B=0), so that semiconductor devices loaded in inserts of the test trays can be inspected.

The cover 170a is a rectangular plate member having a central opening. The first and the second test site 124a and 126a are exposed outside through the central opening of the cover 170a. The cover 170a is made of a metal material similar or identical to that forming the handler 122 or a resin material similar or identical to that forming the Hi-Fix board supports 150 and 152. Further, though the cover 170a is fastened to the Hi-Fix board support 150 via bolts 190 in the example shown in FIG. 9, other connection or fastening mechanism can be employed instead. For example, the cover 170a can be connected to the handler main body 122 by using the first and the second locking device 160 and 162 described above in accordance with the preferred embodiment of the present invention.

If the cover 170a is removed from the test handler 120, the upper and the lower window 142a and 142b each corresponding to a M×N Hi-Fix board are exposed, so that it is possible to use each of the upper and the lower window 142a and 142b as a test site for the M×N Hi-Fix board.

That is, if the cover 170a is attached to the handler main body 122, the first and the second test site 124a and 126a each corresponding to the [(M−A)×(N−B)] Hi-Fix board (for example, M=8, N=20, A=4, B=0) are obtained. Therefore, the test handler 120 in accordance with the present invention can be applied to the [(M−A)×(N−B)] Hi-Fix board. On the other hand, if the cover 170a is separated from the handler main body 122, the upper window 142a and the lower window 142b each corresponding to the external size of the M×N Hi-Fix board are exposed to be used as test sites themselves. Accordingly, it becomes also possible to apply the test handler 120 to the M×N Hi-Fix board.

Figure 10:
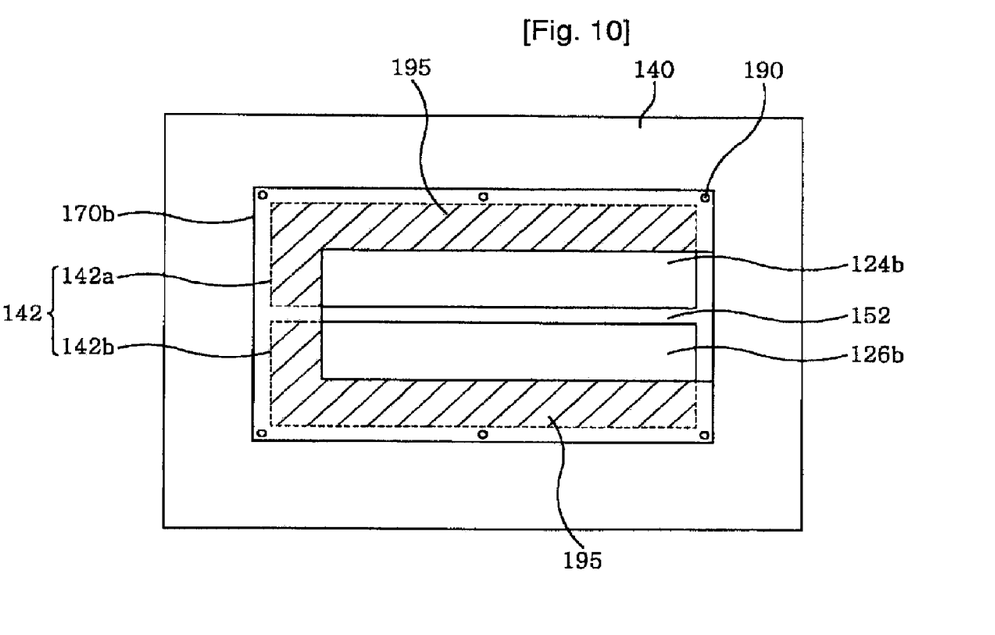
FIG. 10 schematically shows one surface of a test handler having a cover in accordance with another modification of the preferred embodiment of the present invention.

FIG. 10 presents a schematic view illustrating further another modification of a cover attached to any one surface of a test handler.

Though the cover 170a in FIG. 9 is configured to close some rows of the upper and the lower window 142a and 142b, a cover 170b in this example has a one-side opened rectangular shape and closes some rows and some columns of the upper and the lower window 142a and 142b at the same time (shaded portions 195 in the figure represent the areas closed by the cover 170b).

Accordingly, when the cover 170b is applied, the upper and the lower window 142a and 142b are respectively converted into a first and a second test site 124a and 126b each corresponding to a [(M−A)×(N−B)] Hi-Fix board (for example, M=8, N=20, A=4, B=4).

The mechanism for attaching or detaching the cover 170b to or from the handler main body 122 and the function of the cover 170a are identical to those described in the foregoing example using the cover 170a.

In the example shown in FIG. 10, though the cover 170b has the one-side opened rectangular shape to convert the upper and the lower window 142a and 142b into the first and the second test site 124b and 126b each corresponding to the [(M−A)×(N−B)] Hi-Fix board (for example, M=8, N=20, A=4, B=4), the cover 170b can also be fabricated as a plate member having a left half-bracket shape, a right half-bracket shape, a rectangular shape with an opening or a combination of a left- and a right-bracket shape. In each of the cases, the upper and the lower window 142a and 142b can be converted into a first and a second test site 124a and 124b each corresponding to a [(M−A)×(N−B)] Hi-Fix board, though not shown in the drawing.

As can be seen from FIGS. 3 to 10, the test handler 120 in accordance with the preferred embodiments of the present invention or the modifications thereof can be applied to two types of Hi-Fix boards having different external sizes (for example, an 8×16 Hi-Fix board and an 8×20 Hi-Fix board). Accordingly, in case an old-model test equipment is replaced by a new test equipment featuring a higher processing speed, by using the test handler 120 in accordance with the present invention, it is possible to increase the maximum throughput unit per time of the test handler 120 without having to replace the test handler 120 with a new one. Moreover, even in case the new higher-performance test equipment is purchased, the old-model equipment is usually utilized together. In such as case, the test handler in accordance with the present invention can be applied to both of the new and the old-model test equipment. Therefore, the test handler in accordance with the present invention has many advantages when it is applied to the manufacture of semiconductors.

While the invention has been shown and described with respect to the preferred embodiments, it will be understood by those skilled in the art that various changes and modifications may be made without departing from the spirit and scope of the invention as defined in the following claims.

The invention claimed is:

1. A test handler comprising:
    a main body;
    a window formed on a surface of the main body and having a size corresponding to a Hi-Fix board of M×N array (where M and N represent an integer greater than a value of 0); and
    a cover detachably fixed to the main body to close a part of the window and convert the window into a test site having a size corresponding to a [(M−A)×(N−B)] Hi-Fix board (where A is an integer equal to or greater than 0 but smaller than M, and B is an integer equal to or greater than 0 but smaller than N, and where at least one of A and B is an integer having a value other than 0).

2. The test handler of claim 1, wherein the window is converted into a test site corresponding to the M×N Hi-Fix board by separating the cover from the main body.

3. The test handler of claim 1, wherein M, N, A and B have a value of 8, 20, 0 and 4, respectively.

4. The test handler of claim 3, further comprising an 8×20 test tray installed in the window.

5. The test handler of claim 4, wherein 128 inserts in a matrix of 8 rows and 16 columns are arranged on the entire area of the 8×20 test tray except on the first three columns of the test tray from the cover and on the first column from the opposite side, and all of the 128 inserts are exposed through the test site.

6. The test handler of claim 4, wherein 160 inserts in a matrix of 8 rows and 20 columns are arranged on the entire area of the 8×20 test tray.

7. The test handler of claim 6, wherein at least 128 inserts among the 160 inserts are exposed through the test site, and the rest 32 inserts are at least partially closed by the cover.

8. The test handler of claim 6, wherein all of the 160 inserts are exposed through the window if the cover is removed.

9. A semiconductor device subjected to a test using the test handler described in claim 1.

10. A test handler comprising:
    a main body;
    a plurality of windows formed on a surface of the main body, each of which has a size corresponding to a Hi-Fix board of M×N array (where M and N represent an integer greater than a value of 0) and corresponds to a test tray; and
    a cover detachably fixed to the main body to close parts of the windows and convert each of the windows into a test site having a size corresponding to a [(M−A)×(N−B)] Hi-Fix board (where A is an integer equal to or greater than 0 but smaller than M, and B is an integer equal to or greater than 0 but smaller than N, and where at least one of A and B is an integer having a value other than 0), the cover supporting the [(M−A)×(N−B)] Hi-Fix boards.

11. The test handler of claim 10, wherein the cover is a plate member having a central opening.

12. The test handler of claim 10, wherein the cover is a rectangular plate member.

13. The test handler of claim 10, wherein each of the windows is converted into a test site corresponding to the M×N Hi-Fix board by separating the cover from the main body.

14. The test handler of claim 10, wherein a test tray used in testing semiconductor devices with the M×N Hi-Fix board has the same outer size as a test tray used in testing semiconductor devices with the [(M−A)×(N−B)] Hi-Fix board.

15. The test handler of claim 14, wherein the test tray used in testing semiconductor devices with the [(M−A)×(N−B)] Hi-Fix board has inserts at portions corresponding to the [(M−A)×(N−B)] Hi-Fix board.

16. The test handler of claim 14, wherein the test tray used in testing semiconductor devices with the M×N Hi-Fix board is the same as the test tray used in testing semiconductor devices with the [(M−A)×(N−B)] Hi-Fix board.

17. A method for testing semiconductor devices by using a test handler having a plurality of windows, the method comprising:
    converting each of the windows from a test site corresponding to a Hi-Fix board of M×N array (where M and N represent an integer greater than a value of 0) into a test site corresponding to a [(M−A)×(N−B)] Hi-Fix board (where A is an integer equal to or greater than 0 but smaller than M, and B is an integer equal to or greater than 0 but smaller than N, and where at least one of A and B is an integer having a value other than 0) or vice versa; and testing semiconductor devices with the M×N Hi-Fix board or the [(M−A)×(N−B)] Hi-Fix board.

18. The method of claim 17, wherein a test tray used in testing semiconductor devices with the M×N Hi-Fix board has the same outer size as a test tray used in testing semiconductor devices with the [(M−A)×(N−B)] Hi-Fix board.

19. The method of claim 18, wherein the test tray used in testing semiconductor devices with the [(M−A)×(N−B)] Hi-Fix board has inserts at portions corresponding to the [(M−A)×(N−B)] Hi-Fix board.

20. The method of claim 18, wherein the test tray used in testing semiconductor devices with the M×N Hi-Fix board is the same as the test tray used in testing semiconductor devices with the [(M−A)×(N−B)] Hi-Fix board.

21. A test handler comprising:
a main body;
one or more windows, each of which is divided into more than two windows by a Hi-Fix board support, formed on a surface of the main body, each of which has a size corresponding to a Hi-Fix board of M×N array (where M and N represent an integer greater than a value of 0) and corresponds to a test tray; and a cover detachably fixed to the main body to close parts of the windows and convert the windows into test sites, respectively, each of which has a size corresponding to a [(M−A)×(N−B)] Hi-Fix board (where A is an integer equal to or greater than 0 but smaller than M, and B is an integer equal to or greater than 0 but smaller than N, and where at least one of A and B is an integer having a value other than 0), the cover supporting the [(M−A)×(N−B)] Hi-Fix boards.

22. The test handler of claim 21, each of the test sites uses an individual test tray.

23. The test handler of claim 22, inserts which are only corresponding to the [(M−A)×(M-B)] Hi-Fix board are installed on said test tray.

24. The test handler of claim 21, each of the one or more windows is divided into an upper window and a lower window by the Hi-Fix board support which is horizontally arranged.

* * * * *